United States Patent [19]
Wurzburg

[11] 4,403,195
[45] Sep. 6, 1983

[54] PARASITIC INSENSITIVE SWITCHED CAPACITOR OPERATIONAL AMPLIFIER CIRCUIT

[75] Inventor: Henry Wurzburg, Round Rock, Tex.
[73] Assignee: Motorola, Inc., Schaumburg, Ill.
[21] Appl. No.: 314,818
[22] Filed: Oct. 26, 1981
[51] Int. Cl.³ .............................................. H03F 1/02
[52] U.S. Cl. ........................................ 330/9; 330/109
[58] Field of Search .................... 330/9, 51, 107, 109; 333/173

[56] References Cited
U.S. PATENT DOCUMENTS
4,355,285 10/1982 Kelley et al. ........................... 330/9

Primary Examiner—James B. Mullins
Assistant Examiner—Gene Wan
Attorney, Agent, or Firm—Anthony J. Sarli, Jr.; Jeffrey Van Myers; Robert L. King

[57] ABSTRACT

A switched capacitor operational amplifier circuit which has both AC and DC precision and which substantially eliminates parasitic capacitance effects is provided. The operational amplifier circuit utilizes compensated CMOS transmission gates and a structure which switches a parasitic diffusion capacitance between two points of equal voltage potential thereby preventing a charge transfer which would create an offset voltage error.

3 Claims, 4 Drawing Figures

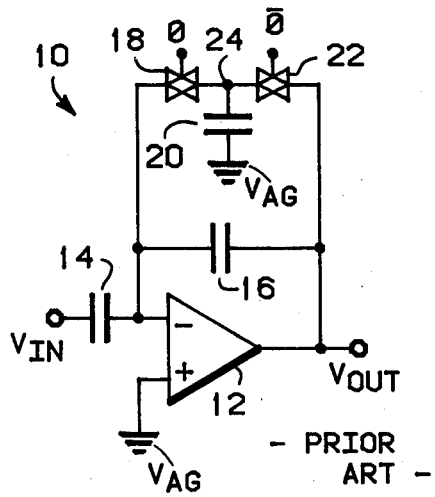
FIG 1 — PRIOR ART —
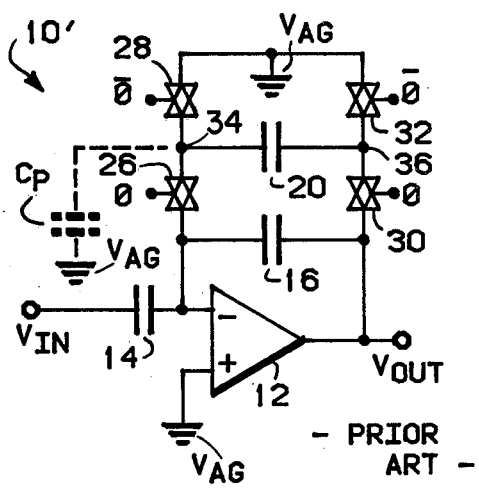
FIG 2 — PRIOR ART —
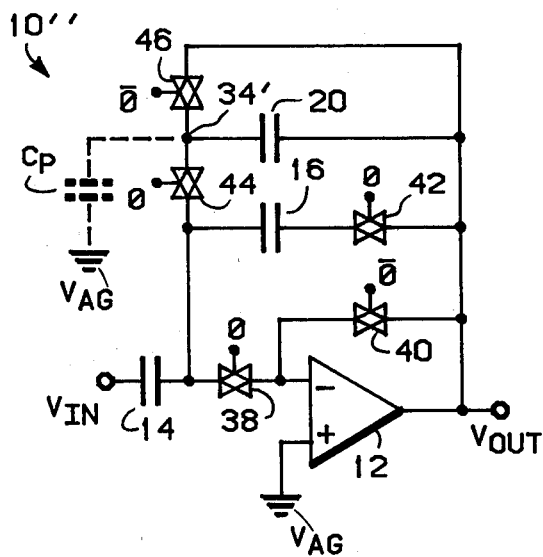
FIG 3
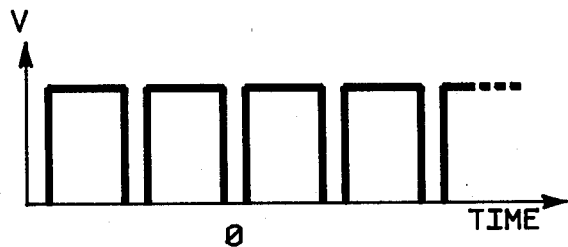
FIG 4

PARASITIC INSENSITIVE SWITCHED CAPACITOR OPERATIONAL AMPLIFIER CIRCUIT

TECHNICAL FIELD

This invention relates generally to operational amplifier circuits and, more particularly, to a switched capacitor operational amplifier circuit which is insensitive to parasitic capacitance effects.

BACKGROUND ART

In general, operational amplifier circuits which utilize switched capacitors have an additional output voltage error which is separate from the offset voltage normally associated with an operational amplifier. Such additional contributions to the offset voltage result from both parasitic diffusion capacitance and gate overlap capacitance associated with switches used to switch the circuit's capacitors. Parasitic diffusion capacitance exists at every pn junction formed between a substrate and an implant in a conventional MOS transmission gate switch. Gate overlap capacitance occurs between every pn junction of a transmission switch and the gate in a conventional MOS transmission gate switch when the gate region slightly overlaps above the implanted region. Unfortunately, parasitic diffusion capacitance and gate overlap capacitance negatively affect both the AC and DC performance of an operational amplifier circuit. Typically, compensated switches having symmetrical structures can be used to reduce the DC component of output voltage error produced by the effects of gate overlap capacitance. The symmetrical nature of the compensated switch tends to cause charges which are injected through the parasitic gate overlap capacitances to nullify each other. However, compensated switches do not substantially reduce the AC component of output voltage error caused by either type of parasitic capacitance.

A partial solution to eliminate both AC and DC offset errors resulting from gate overlap and diffusion capacitance effects has been to use additional compensated switches in a symmetrical bridge switching structure. Although the use of compensated switches in a symmetrical bridge switching structure substantially eliminates the DC component of offset voltages due to gate overlap capacitance and the symmetrical structure of such circuits substantially eliminates undesirable effects of the parasitic capacitance on the AC precision, such circuits do not compensate for the DC parasitic diffusion component to the output voltage.

SUMMARY OF THE INVENTION

Accordingly, an object of the present invention is to provide an improved parasitic insensitive switched capacitor operational amplifier circuit.

Another object of this invention is to provide an improved switched capacitor operational amplifier circuit having an output voltage with substantially no AC or DC parasitic components.

Yet another object of this invention is to provide an improved switched capacitor operational amplifier circuit having switches arranged in a manner to substantially eliminate parasitic effects and the resulting AC and DC output voltage errors.

In carrying out the above and other objects and advantages of the present invention, there is provided, in one form, an operational amplifier which has a feedback capacitor and a switched parasitic insensitive stabilizing capacitor connected in a feedback path with a first terminal thereof coupled to an inverting input via first switching means and a second terminal or node coupled to an output via second switching means. Parasitic diffusion capacitance at the second terminal of the stabilizing capacitor (i.e. the low impedance output of the operational amplifier) is irrelevant since the node is alternately driven by the operational amplifier and circuit ground. In other words, no output voltage errors are created by changes in the voltage stored by the parasitic capacitance at the second terminal node since such changes never appear across the stabilizing or feedback capacitors. Parasitic diffusion capacitance at the first terminal of the stabilizing capacitor also does not provide an offset error because the first terminal node is alternately charged and discharged to the identical voltage by switching from the output to the input of the operational amplifier. When the first terminal is switched to the output, the operational amplifier is switched into a unity gain configuration so that the input offset of the amplifier present at the output is charged onto the parasitic diffusion capacitance at the first terminal. When the first terminal is later switched to the input, the operational amplifier is simultaneously switched to normal operation and the parasitic diffusion capacitance associated with the first terminal is discharged to the offset voltage of the operational amplifier present at the input. Since the offset voltage at the output and input of the operational amplifier is now the same voltage, no charge transfer occurs across the parasitic diffusion capacitance. Thus the parasitic diffusion capacitance at the input node of the stabilizing capacitor, however large it may be, has no effect whatsoever on the circuit's output voltage.

BRIEF DESCRIPTION OF THE DRAWINGS

FIG. 1 is a schematic diagram illustrating a circuit of the prior art;

FIG. 2 is a schematic diagram illustrating another circuit of the prior art;

FIG. 3 is a schematic diagram illustrating one preferred embodiment of the invention; and FIG. 4 is a graphic timing diagram of the control signal for the schematic diagrams of FIGS. 1, 2 and 3.

DETAILED DESCRIPTION OF THE DRAWINGS

FIG. 1 illustrates an inverting operational amplifier stage 10 commonly used in the prior art. An operational amplifier 12 has an inverting input terminal AC coupled to an input voltage $V_{IN}$ via a capacitor 14 and has a noninverting input terminal coupled to a reference voltage, say analog ground, $V_{AG}$. A feedback capacitor 16 is coupled from the inverting input terminal to an output terminal of operational amplifier 12. A switch 18 has a first terminal coupled to the inverting input terminal and a second terminal coupled to a first terminal of a stabilizing capacitor 20. The second terminal of stabilizing capacitor 20 is coupled to the reference $V_{AG}$. A switch 22 has a first terminal coupled to the first terminal of stabilizing capacitor 20 and a second terminal coupled to the output of operational amplifier 12. In a commonly known embodiment, switches 18 and 22 are MOS transmission gates which are clocked in a conventional manner by a repeating clock pulse $\phi$, shown in FIG. 4, and its complement $\overline{\phi}$. For example, switch 18 is constructed to be conductive when clock signal ∅ is applied to the control input thereof in a high state and non-conductive when clock signal ∅ is at a low state.

In operation, switch 22 is initially closed by ∅ at which time switch 18 is opened thereby allowing the output voltage to charge onto stabilizing capacitor 20. Then switch 22 is opened and switch 18 is closed thereby coupling the charge on stabilizing capacitor 20 into the inverting input terminal. The voltage gain and frequency pole location of operational amplifier stage 10 are determined, in part, by the value of stabilizing capacitor 20. However, little control exists over these two important circuit parameters even if switches 18 and 22 are compensated to eliminate the DC effects of gate overlap capacitance. The parasitic diffusion capacitance associated with switches 18 and 22 is coupled in parallel with stabilizing capacitor 20 between node 24 and $V_{AG}$, thereby increasing the value of stabilizing capacitor 20 and varying the gain and AC frequency response of amplifier stage 10. The charge stored by the parasitic diffusion capacitance appears at the output of operational amplifier 12 as an additional offset voltage.

A partial solution to the disadvantages of the circuit of FIG. 1 which is known in the prior art is shown in FIG. 2. An inverting operational amplifier stage 10' comprises operational amplifier 12 which has an inverting input terminal AC coupled to input voltage $V_{IN}$ via capacitor 14 as previously shown in FIG. 1. The noninverting input terminal is again coupled to $V_{AG}$ and feedback capacitor 16 is coupled from the inverting input terminal to the output terminal of operational amplifier 12. A switch 26, which is made conductive when ∅ is in a high state, has a first terminal coupled to the inverting input terminal and a second terminal coupled to the first terminal of stabilizing capacitor 20. A switch 28, which is made conductive when ∅ is in a high state, has a first terminal coupled to the first terminal of stabilizing capacitor 20 and a second terminal coupled to $V_{AG}$. Therefore, the first terminal of stabilizing capacitor 20 can be switched between the inverting input of operational amplifier 12 and $V_{AG}$. A switch 30, which is made conductive when ∅ is in a high state, has a first terminal coupled to the second terminal of stabilizing capacitor 20 and a second terminal coupled to the output. A switch 32, which is made conductive when ∅ is in a high state, has a first terminal coupled to the second terminal of stabilizing capacitor 20 and a second terminal coupled to $V_{AG}$. Thus the second terminal of stabilizing capacitor 20 can be switched between the output of operational amplifier 12 and $V_{AG}$. In a typical embodiment, switches 26, 28, 30 and 32 are CMOS transmission gates which are clocked in a conventional manner comparable to the switches of FIG. 1.

In operation, the circuit of FIG. 2 is immune from the AC component of output voltage error caused by the diffusion capacitance associated with switches 26, 28, 30 and 32. Parasitic capacitance existing at nodes 34 and 36 does not add an AC component to the output voltage. In essence, node 34 is always switched between analog ground $V_{AG}$ and the inverting input terminal which is also at the voltage potential of $V_{AG}$. Node 36 is switched between $V_{AG}$ and the output which are both low impedance sources. The AC voltage potential of the first terminal of capacitor 20 never changes and the AC voltage potential at the second terminal of capacitor 20 is changing only with the signal $V_{IN}$. As a result, only the proper amount of charge is transferred across $C_{20}$. Thus, parasitic gate overlap and diffusion capacitances at nodes 34 and 36 do not determine the amount of charge transferred to the noninverting input of operational amplifier 12. Therefore, the AC frequency response is exactly determined by the value of capacitor 14, 16, and 20.

However, the disadvantage with the circuit of FIG. 2 is that the circuit still has a DC component of output voltage error. The parasitic diffusion capacitance $C_p$ associated with switches 26 and 28, as shown in FIG. 2 existing between node 34 and $V_{AG}$, stores a finite amount of charge because node 34 is alternately switched between $V_{AG}$ and the noninverting input. The voltage potential at the noninverting input in reality is not equal to $V_{AG}$, but rather is at a voltage potential equal to the offset voltage of the operational amplifier. Since the charge stored by the parasitic capacitance is independent of the level of the input voltage signal $V_{IN}$, the parasitic charge appears as a DC offset error at the output. Although the circuit of FIG. 2 has obtained AC precision, the circuit has no DC precision. DC precision is obtained by the circuit of FIG. 1 by compensating switch 18 for its contribution of DC parasitic charge, but due to the switching between two different voltage potentials, the circuit of FIG. 2 is not aided by being compensated in this manner. By utilizing offset compensation circuits known in the prior art, both circuits of FIGS. 1 and 2 may substantially correct the output offset errors. However, such additional offset correction circuits are not suitable in many applications, such as for A/D converters.

The circuit shown in FIG. 3 overcomes the stated disadvantages with the prior art and provides an operational amplifier stage 10" having both AC and DC precision. Operational amplifier 12 has the inverting input terminal AC coupled to input voltage $V_{IN}$ by capacitor 14 via switch 38 which is made conductive when ∅ is in a high state. Switch 38 has a first terminal coupled to the inverting input of operational amplifier 12 and a second terminal coupled to capacitor 14. The noninverting input of operational amplifier 12 is coupled to $V_{AG}$ and the inverting input is coupled to the output via a switch 40 which is made conductive when ∅ is in a high state for operating operational amplifier 12 in a unity gain configuration. Feedback capacitor 16 has a first terminal coupled to the second terminal of switch 38 and a second terminal coupled to the output via a switch 42 which is made conductive when ∅ is in a high state. Stabilizing capacitor 20 has a first terminal coupled to both the first terminal of feedback capacitor 16 and the second terminal of switch 38 via a switch 44. Capacitor 20 has a second terminal coupled to the output. Switch 44 is made conductive when ∅ is in a high state. A switch 46 is coupled in parallel with stabilizing capacitor 20 between the first terminal of capacitor 20 and the output for selectively discharging capacitor 20 when ∅ is in a high state. In the preferred form, switches 38, 40, 42, 44 and 46 are MOS transmission gates which are clocked in a conventional manner.

In operation, operational amplifier stage 10" still has parasitic diffusion capacitance $C_P$ associated with node 34'. However, node 34' is prevented from moving or changing in voltage potential by the switching action and therefore the capacitance $C_P$ is prevented from shifting charge. Node 34' is switched between the noninverting input which is at the potential of $V_{OS}$ and the output which is also at the potential of $V_{OS}$ when the operational amplifier 12 is placed in a closed loop configuration by switch 40. Simultaneous with the switching of operational amplifier 12 into a closed loop configuration by closing switch 40, switch 46 shorts out stabilizing capacitor 20 to allow node 34' to be switched to the $V_{OS}$ at the output. When node 34' is switched to the $V_{OS}$ at the input, the amplifier stage 10" is switched into a typical inverting amplifier configuration. Since node 34' has been switched to an identical voltage, no charge has been moved by $C_P$. Of course, switches 44 and 46 must be compensated switches in the same way switches 18 and 22 of FIG. 1 are compensated in order to eliminate the DC component of gate overlap capacitance.

Therefore, operational amplifier stage 10" is an inverting amplifier with DC stabilization in an AC parasitic free form with stabilizing capacitor 20 providing precise AC performance. The only disadvantage with this configuration is that a valid output from the operational amplifier stage 10" is not obtainable when ∅ is at a high state which places operational amplifier 12 in a unity gain configuration. However, the invalid output period can be reduced to a short percentage of the operating time if ∅ is at a low state for the majority of the cycle. The frequency of the control signal ∅ is limited primarily by the slew rate of operational amplifier 12.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A parasitic insensitive switched capacitor inverting operational amplifier circuit, comprising:

operational amplifier means having a first input coupled to a reference voltage, a second input and an output, for developing an output voltage proportional to the difference in voltages applied to the inputs thereof;

first switching means coupled to said second input and output, for providing a unity gain amplifier;

first feedback capacitance means having first and second terminals;

second switching means for coupling said second input to the first terminal of said first feedback capacitance means;

third switching means for coupling said output to the second terminal of said first feedback capacitance means;

second feedback capacitance means having a first terminal coupled to said output and a second terminal, for providing additional stability to said amplifier circuit;

fourth switching means for coupling the second terminal of said second feedback capacitance means to both the first terminal of said first feedback capacitance means and the second switching means; and fifth switching means for selectively discharging the second feedback capacitance means when the operational amplifier is switched to a unity gain amplifier.

2. The circuit of claim 1 further comprising:

clock means for providing a clock signal and the complement thereof which together control all switching means.

3. The circuit of claim 2 wherein said clock signal comprises a repeating pulse signal of high and low levels wherein the duration of said high level pulses is substantially greater than the duration of said low level pulses.

* * * * *